US010377217B1

(12) United States Patent
Pradeepkumar et al.

(10) Patent No.: US 10,377,217 B1
(45) Date of Patent: Aug. 13, 2019

(54) POWER SUPPLY DEVICE

(71) Applicant: FORD GLOBAL TECHNOLOGIES, LLC, Dearborn, MI (US)

(72) Inventors: Akash Changarankumarath Pradeepkumar, Westland, MI (US); Alfredo R. Munoz, Ann Arbor, MI (US); Michael W. Degner, Novi, MI (US); Edward Chan-Jiun Jih, Troy, MI (US); Guangyin Lei, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 16/000,540

(22) Filed: Jun. 5, 2018

(51) Int. Cl.
*B60R 16/04* (2006.01)
*B60K 1/04* (2019.01)
*H02M 7/537* (2006.01)
*B60R 16/023* (2006.01)

(52) U.S. Cl.
CPC ............ *B60K 1/04* (2013.01); *B60R 16/0231* (2013.01); *H02M 7/537* (2013.01)

(58) Field of Classification Search
CPC .. B60R 16/04; B60R 11/00; B60K 2001/0455
USPC ...................................................... 180/68.5
See application file for complete search history.

(56) References Cited

U.S. PATENT DOCUMENTS

| | | | | |
|---|---|---|---|---|
| 5,813,641 A * | 9/1998 | Baldwin | ............... | A47B 57/565 248/223.41 |
| 6,230,833 B1 * | 5/2001 | Setsuda | ................... | B60R 16/04 123/184.21 |
| 6,571,898 B2 * | 6/2003 | Guyomard | ............. | B60K 11/04 165/69 |
| 6,593,027 B1 * | 7/2003 | Osterhart | ............ | H01M 2/0237 429/100 |
| 6,892,796 B1 | 5/2005 | Nagashima et al. | | |
| 6,942,945 B2 * | 9/2005 | Andersen | ............ | H01M 2/1005 429/100 |
| 7,331,559 B2 * | 2/2008 | Hirayu | .................... | B60R 16/04 180/68.5 |
| 7,389,841 B2 * | 6/2008 | Boville | ................... | B60R 16/04 180/68.5 |
| 7,656,016 B2 | 2/2010 | Yoshimatsu et al. | | |
| 7,726,427 B2 * | 6/2010 | Picavet | ............... | H01M 2/1083 180/68.5 |
| 8,225,969 B2 * | 7/2012 | Quinn | ..................... | F16B 2/065 180/68.5 |
| 2002/0079152 A1 * | 6/2002 | Van Hout | ............... | B60R 16/04 180/68.5 |
| 2011/0013429 A1 * | 1/2011 | Campbell | ................ | B60K 1/04 363/40 |
| 2014/0340847 A1 | 11/2014 | Iwakiri et al. | | |

* cited by examiner

*Primary Examiner* — Brian L Swenson
(74) *Attorney, Agent, or Firm* — David Kelley; Brooks Kushman P.C.

(57) ABSTRACT

A vehicle power supply includes a housing, a backing plate, a power assembly, and a clamp. The housing has a bottom wall and a side wall. The backing plate extends from the bottom wall. The power assembly has an array of electrical switching units that extend from the side wall to the backing plate. The clamp extends from the backing plate and is configured to engage a backside of the array such that a frontside of the array is forced into engagement with the side wall.

15 Claims, 3 Drawing Sheets

POWER SUPPLY DEVICE

TECHNICAL FIELD

The present disclosure relates to electric/hybrid vehicles and power supply devices for electric/hybrid vehicles.

BACKGROUND

Electric and hybrid vehicles may include power modules that are configured to convert DC electrical power from a traction battery into AC electrical power in order to supply AC electrical power to a motor that is configured to propel the vehicle.

SUMMARY

An electric vehicle power supply that is configured to convert DC electrical power into AC electrical power includes a housing, a backing plate, an inverter assembly, and a clamp. The housing has a lower wall and a vertical wall extending from the lower wall. The backing plate is secured to and extends from the lower wall. The inverter assembly has an array of electrical switching units that are arranged horizontally between the vertical wall and the backing plate. The clamp extends from the backing plate and is configured to engage a first end of the array to force a second end of the array into engagement with the vertical wall.

A vehicle power supply includes a housing, a backing plate, a power assembly, and a clamp. The housing has a bottom wall and a side wall. The backing plate extends from the bottom wall. The power assembly has an array of electrical switching units that extend from the side wall to the backing plate. The clamp extends from the backing plate and is configured to engage a backside of the array such that a frontside of the array is forced into engagement with the side wall.

A vehicle power supply includes a lower wall, a vertical wall, a backing plate, an array of electrical switching units, and a clamping plate. The backing plate extends from the lower wall such that a gap is defined between the backing plate and vertical wall. The array of electrical switching units is disposed within the gap. The clamping plate extends from the backing plate and is configured to engage a proximal end of the array to force a distal end of the array into engagement with the vertical wall.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
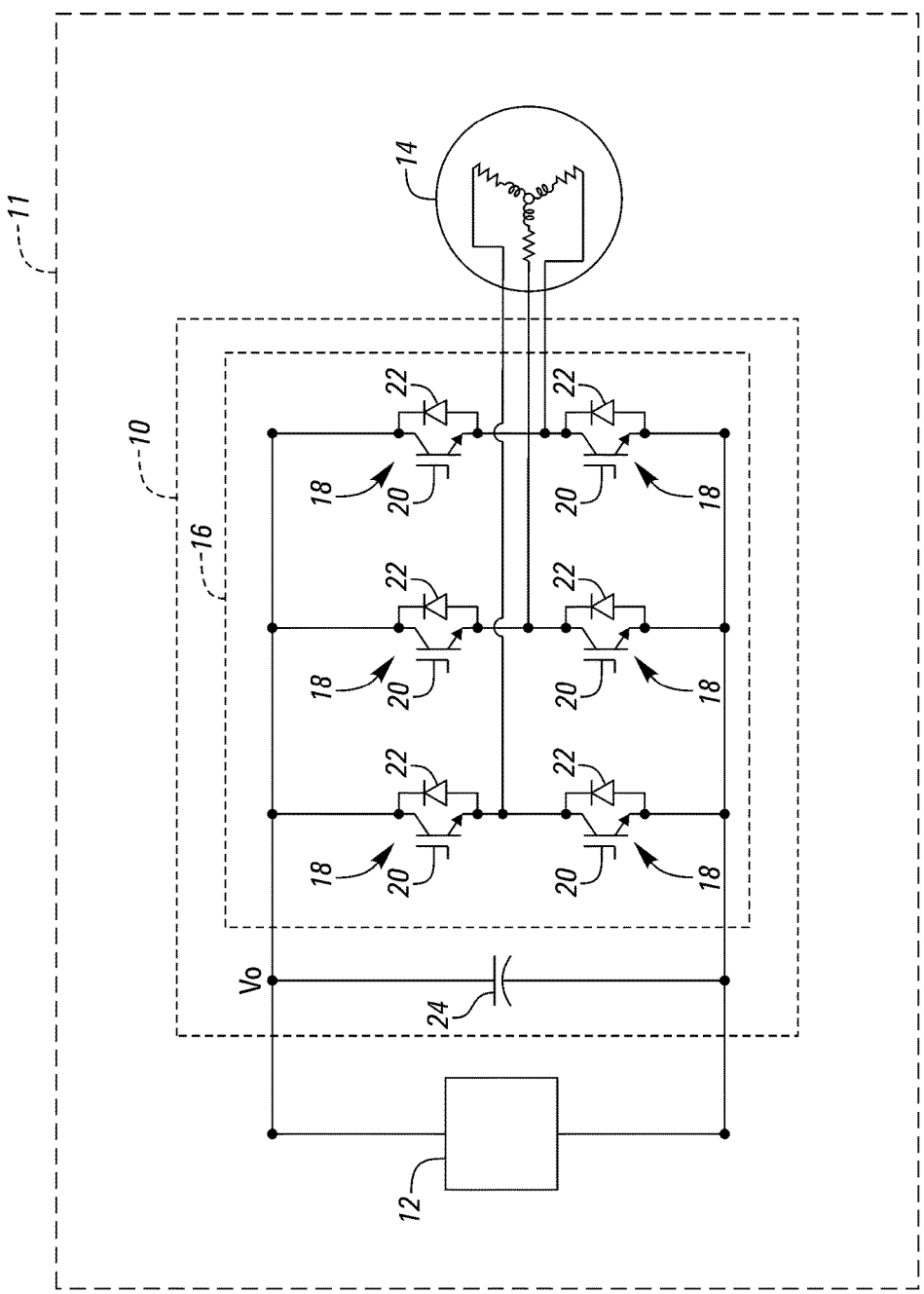
FIG. 1 is a circuit diagram illustrating a power supply device coupled to a power source and a load.

Referring to FIG. 1, a circuit diagram of a power supply device 10 coupled to a power source 12 and a load 14 is illustrated. The power supply device 10 is configured to convert direct (DC) electrical current into alternating (AC) electrical current. The power supply device 10 may be utilized in an electric drive system of a vehicle 11, such as an electric or hybrid vehicle. The power source 12 may be coupled to the power supply device 10 in order to drive the load 14. In some contexts, including the context of an electric or hybrid vehicle, the power source 12 may be a battery, such as a traction battery, and the load 14 may be an electric machine such as an electric motor or electric motor/generator. The power source 12 may further comprise a high voltage battery that is coupled to a voltage converter (not shown). The power supply device 10 may include a power assembly or power module 16. The power module 16 may be configured to deliver electrical power to the load 14. Furthermore, the power module 16 may be an inverter or inverter assembly, which is the subcomponent of the power supply device 10 that converts DC electrical current into AC electrical current.

The power module 16 includes inverting circuitry. The inverting circuitry may include switching units 18. The switching units 18 may each comprise a transistor 20, such as an insulated gate bipolar transistor (IGBT), in antiparallel with a diode 22. The switching units 18 may be configured to provide alternating current to the load 14. The power supply device 10 may include a linking capacitor 24. The linking capacitor 24 may be disposed between the power source 12 and the power module 16. The linking capacitor 24 may be configured to absorb ripple currents generated at the power module 16 or the power source 12, and stabilize the DC-link voltage, $V_o$, for power module 16 control. Stated in other terms, the linking capacitor 24 may be arranged to limit voltage variation at an input of inverting circuitry due to ripple currents generated by the inverting circuitry in the power module 16 or a battery, such as a traction battery, that may comprise the power source 12.

The disclosure should not be construed as limited to the circuit diagram in FIG. 1, but should include power supply devices that include other types power modules, inverters, capacitors, or combinations thereof. For example, the power module 16 may be an inverter that includes any number of switching units and not limited to the number of switching units depicted in FIG. 1. Alternatively, the linking capacitor 24 may be configured to couple one or a plurality of inverters to a power source.

Furthermore, it should be understood that the vehicle configuration described herein is merely exemplary and is not intended to be limited. Other electric or hybrid vehicle configurations that include other power sources, such as an internal combustion engine, should be construed as disclosed herein. Other electric or hybrid vehicle configurations may include, but are not limited to, series hybrid vehicles, parallel hybrid vehicles, series-parallel hybrid vehicles, plug-in hybrid electric vehicles (PHEVs), fuel cell hybrid vehicles, battery operated electric vehicles (BEVs), or any other electric or hybrid vehicle configuration known to a person of ordinary skill in the art.

Figure 2:
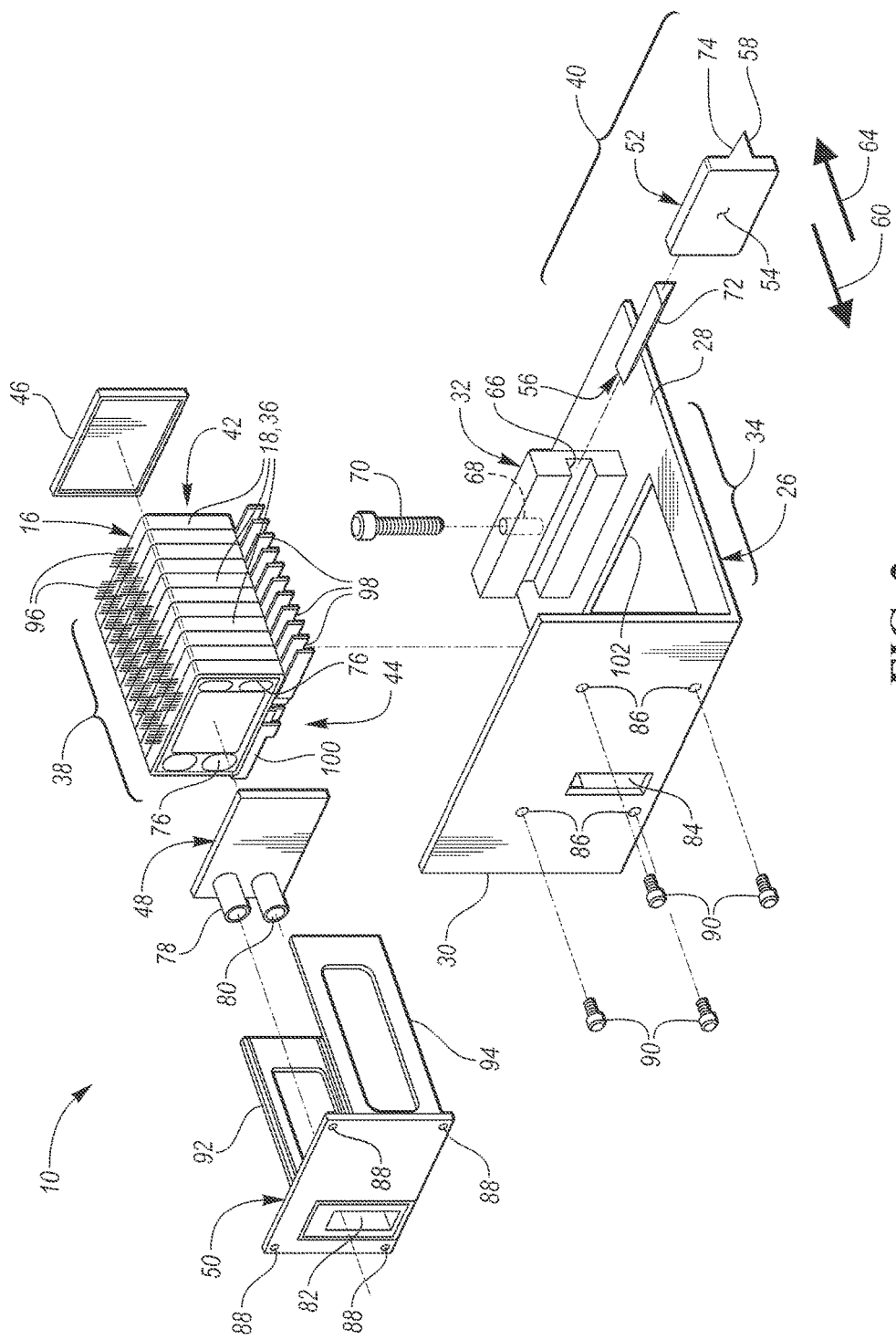
FIG. 2 is a front exploded isometric view of a power supply device for an electric or hybrid vehicle.
Figure 3:
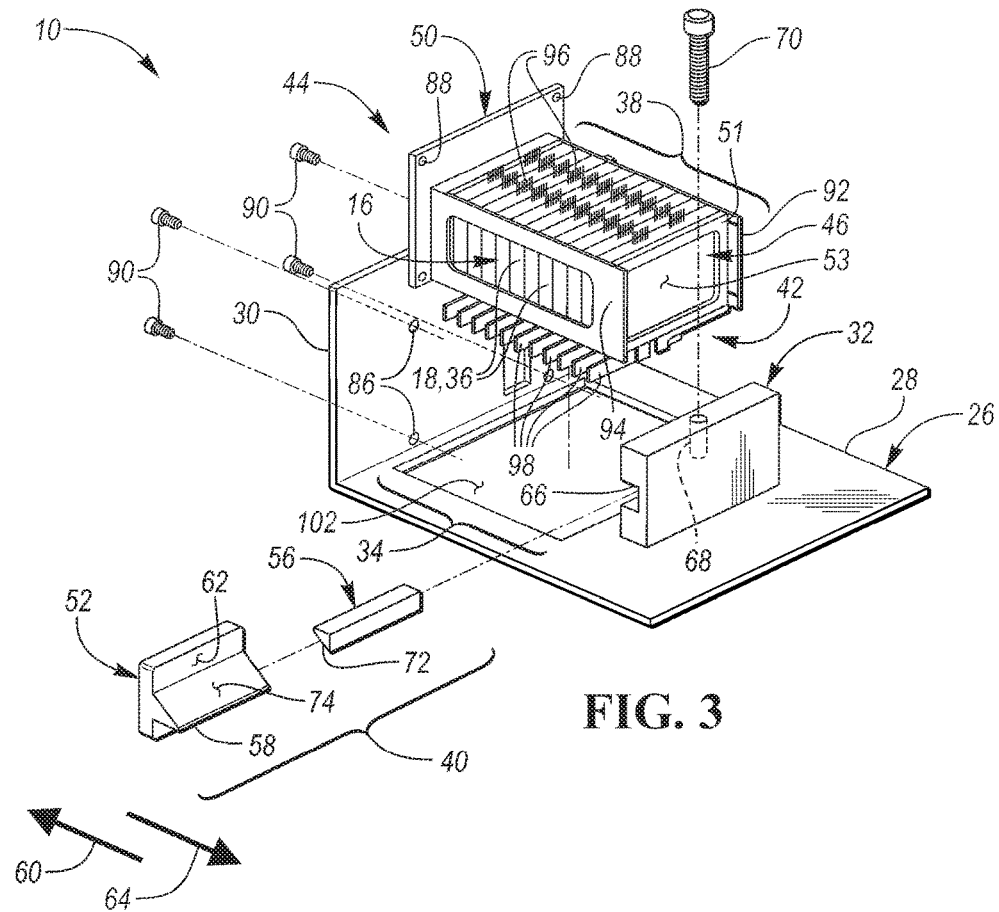
FIG. 3 is a rear exploded isometric view of the power supply device.
Figure 4:
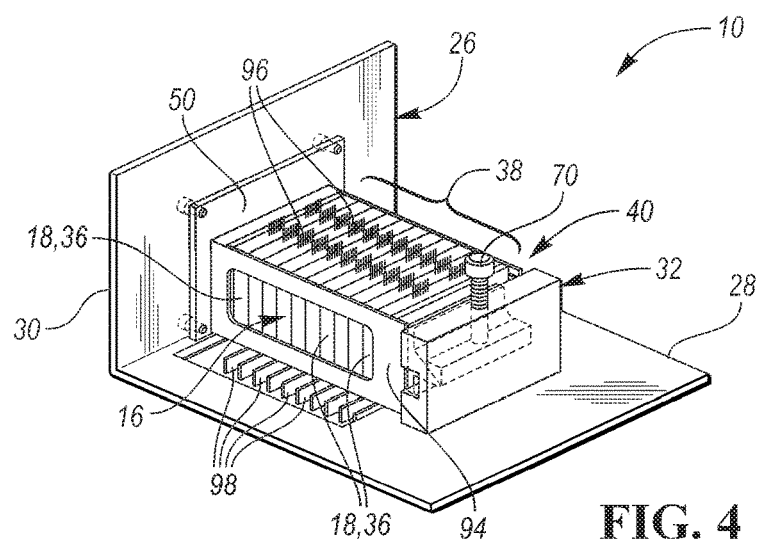
FIG. 4 is a rear isometric view of the power supply device.

Referring to FIGS. 2-4, the power supply device 10 is illustrated. The power supply device 10 includes a housing 26. The housing 26 has a bottom or lower wall 28 and a side or vertical wall 30. The vertical wall 30 may extend upward from the lower wall 28. More specifically the vertical wall 30 may extend upward from the lower wall 28 at a substantially perpendicular angle. Substantially perpendicular may refer to any incremental value between 80° and 100°. The power supply device 10 includes a backing plate 32 that is secured to and extends upward from the lower wall 28 such that a gap 34 is defined between the backing plate 32 and vertical wall 30. The switching units 18 of the power module 16 (or inverter assembly) may be disposed within external cases 36 that house the circuitry of the switching units 18. More specifically, each external case 36 may house a pair switching units 18 that, when connected to the power source 12, are arranged in series between positive and negative terminals of the power source 12. The switching units 18, or more specifically the external cases 36 of the switching units 18, are disposed within the gap 34 and form an array 38 that is arranged and extends horizontally between the vertical wall 30 and the backing plate 32.

The power supply device 10 includes a clamp or clamping mechanism 40 that extends from the backing plate 32 and is configured to engage a first end 42 of the array 38 to force a second 44 end of the array 38 into engagement with the vertical wall 30. The first end 42 of the array 38 may alternatively be referred to as the backside of the array 38 or the proximal end of the array 38. The second end 44 of the array 38 may alternatively be referred to as the frontside of the array 38 or the distal end of the array 38. The first end 42 of the array 38 may be secured to an end cover 46 while the second end 44 of the array 38 may secured to one or more front covers (e.g., a first front cover 48 and a second front cover 50). Therefore, in embodiments that include front and end covers, the clamping mechanism 40 may engage the first end 42 of the array 38 indirectly via the end cover 46 to force the second end 44 of the array 38 into engagement with the vertical wall 30 indirectly via one or more front covers. The end cover 46 may include a peripheral ridge 51 that defines a recess 53 along a back surface of the end cover 46. The recess 53 may be configured to receive the clamping plate 52 during engagement. The peripheral ridge 51 may extend around the clamping plate 52 when the clamping plate 52 engages the end cover 46. The peripheral ridge 51 may retain the clamping plate 52 during engagement to ensure the clamping plate 52 is properly held in proper alignment relative to the end cover 46 and the array 38. The peripheral ridge 51 also prevents the clamping plate 52 from slipping during assembly.

Seals may be disposed between adjacent switching units 18 (or more specifically between adjacent external cases 36). Seals may also be disposed between the switching unit 18 (or more specifically the external case 36) at the first end 42 of the array 38 and the end cover 46, and between the switching unit 18 (or more specifically the external case 36) at the second end 44 of the array 38 and the first front cover 48. The sealing elements may be any type of adhesive, glue, gasket, etc. The sealing elements may be provided on outer peripheries of the switching units 18 (or more specifically the external cases 36 of the switching units 18), first front cover 48, and end cover 46.

The clamping mechanism 40 may more specifically include a clamping plate 52 that engages the first end 42 of the array 38 (directly or indirectly via the end cover 46) to force the second end 44 of the array 38 into engagement with the vertical wall 30 (directly or indirectly via one or more front covers). The clamping plate 52 may be arranged such that a front surface 54 that engages the first end 42 of the array 38 extends in an upward and vertical direction.

The clamping mechanism 40 may include a first wedge block 56 and a second wedge block 58. The first wedge block 56 tapers in a first direction 60 that extends from the backing plate 32 toward the vertical wall 30. The second wedge block 58 protrudes and extends from a back surface or backside 62 of the clamping plate 52. The second wedge block 58 tapers in a second direction 64 that is opposite to the first direction 60. More specifically, the second direction 64 extends from the vertical wall 30 toward the backing plate 32. The first wedge block 56 is configured to engage the second wedge block 58 to force the clamping plate 52 into engagement with the first end 42 of the array 38 (directly or indirectly via the end cover 46). The backing plate 32 may define a slot 66. The first wedge block 56 and the second wedge block 58 may each be at least partially disposed and retained within the slot 66.

The backing plate 32 may further define a tapped orifice 68 that is in communication with the slot 66. A fastener 70 may engage (i.e., may be threaded into) the tapped orifice 68 and extend into the slot 66. The fastener 70 may be configured to engage the first wedge block 56 such that the first wedge block 56 engages the second wedge block 58 to force the clamping plate 52 into engagement with the first end 42 of the array 38 (directly or indirectly via the end cover 46). More specifically, the fastener 70, when threaded downward into the tapped orifice 68, may push downward on the first wedge block 58 and force a first (or bottom) ramped surface 72 defined on the first wedge block 56 into engagement with a second (or top) ramped surface 74 defined on the second wedge block 58. The engagement between the first ramped surface 72 and the second ramped surface 74 translates the downward movement of the fastener 70 into horizontal movement of the clamping plate 52 in the first direction 60, and therefore forces the clamping plate 52 into engagement with the first end 42 of the array 38 (directly or indirectly via the end cover 46).

The clamping mechanism 40, or more specifically the clamping plate 52, translates and distributes the force applied by a single fastener 70 over a large area (i.e., the front surface 54). The force is then translated from the clamping plate 52 to the array 38 of switching units 18 in order to secure the array 38 of switching units 18 between the vertical wall 30 of the housing 26 and the backing plate 32. The resulting force is an evenly distributed compression force within the array 38 of switching units 18 that extends between the vertical wall 30 and the backing plate 32. When mounting the power module 16, it is desirable to avoid applying a concentrated force by a single faster to the switching units 18 or to the external cases 36 of the switching units 18. Such a concentrated force may result in undesirable stress, strain, or damage to the switching units 18 or to the external cases 36 of the switching units 18. The clamping mechanism 40 reduces or eliminates any potential undesirable stress, strain, or damage by distributing the force of a single fastener 70 over a large area (i.e., the front surface 54 of the clamping plate) in order to secure the array 38 of switching units 18 between the vertical wall 30 and the backing plate 32.

A cooling manifold (not shown) may be disposed within a series of aligned openings 76. Each aligned opening 76 is defined within one of the external cases 36. The openings 76 may become aligned when the external cases 36 are arranged in the array 38 that extends horizontally between the vertical wall 30 and the backing plate 32. A coolant or cooling liquid may be routed through the cooling manifold in order to cool the switching units 18. Alternatively, the cooling manifold may be omitted and the coolant or cooling liquid may be routed directly through the aligned openings 76 to cool the switching units 18.

The first front cover 48 may include an inlet port 78 and an outlet port 80 that is configured to route the coolant or cooling liquid into and out of the cooling manifold (or alternately the aligned openings 76) in order to transfer heat away from the switching units 18. The second front cover 50 may define a first opening 82 and the vertical wall 30 may define a second opening 84. The inlet port 78 and the outlet port 80 may each extend through the first opening 82 and the second opening 84 such that the inlet port 78 and the outlet port 80 extend beyond an exterior of the housing 26.

The vertical wall 30 may define a series of through holes 86 and the second front cover 50 may define a series of tapped holes 88 that align with the through holes 86, or vice versa. Each of a series of fasteners 90 may extend through one of the through holes 86 and may engage (i.e., may be threaded into) one of the tapped holes 88 to secure the second front cover 50 to the vertical wall 30. A first side rail 92 and a second side rail 94 may extend from the second front cover 50 to the backing plate 32. The first side rail 92 and second side rail 94 may engage opposing sides of the array 38 of switching units 18, respectively, to retain the individual switching units 18 within the array 38. More specifically, the first side rail 92 and second side rail 94 may engage opposing sides of the external cases 36, respectively, to retain the external cases 36 within the array 38.

The second front cover 50 may provide structural rigidity to the assembled power supply device 10. The second front cover 50 may also assist in alleviating stresses induced to the switching units 18 and/or to the external cases 36. The first side rail 92 and second side rail 94 of the second front cover may include alignment features, such as tabs or extensions, that engage alignment features on the external cases 36 and/or end cover 46, such as orifices that receive tabs. The alignment features assist in maintaining alignment of the switching units 18, which in turn reduces the amount of stress that is applied to the switching units 18 and/or the external cases 36, from the external environment.

The switching units 18 of the power module 16 include connectors 96 that protrude or extend from the external cases 36. The connectors 96 are configured to couple each switching unit 18 of the power module 16 to a controller (not shown). The controller may be a gate drive board that is configured to operate the transistors 20 of the switching units 18 of the power module 16 when delivering electrical power to the load 14, which includes converting DC electrical current into AC electrical current.

The switching units 18 of the power module 16 also includes a first set of terminals 98 that are configured to couple each switching unit 18 to the load 14 and a second set of terminals 100 that are configured to couple each switching unit 18 to the power source 12. The second set of terminals 100 may also be configured to couple each switching unit 18 to the linking capacitor 24. The lower wall 28 of the housing 26 may define an opening 102 to provide access to the first set of terminals 98 and the second set of terminals 100 so that electrical connections to the power source 12, load 14, and linking capacitor 24 may be made thereto. The second set of terminals 100 may include positive and negative terminals. The positive and negative terminals of the second set of terminals 100 may be connected to positive and negative connections of a primary bus (not shown), which in turn connects the positive and negative terminals of the second set of terminals 100 to the power source 12 and the linking capacitor 24.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. An electric vehicle power supply configured convert DC electrical power into AC electrical power comprising:
   a housing having a lower wall and a vertical wall extending therefrom;
   a backing plate secured to and extending from the lower wall;
   an inverter assembly having an array of electrical switching units arranged horizontally between the vertical wall and the backing plate; and
   a clamp extending from the backing plate and configured to engage a first end of the array to force a second end of the array into engagement with the vertical wall, the clamp including a vertically extending clamping plate, a first wedge block, and a second wedge block, wherein the vertically extending clamping plate engages the first end of the array, the first wedge block tapers in a first direction from the backing plate toward the vertical wall, the second wedge block extends from a backside of the vertically extending clamping plate and tapers in a second direction that is opposite the first direction, and wherein the first wedge block is configured to engage the second wedge block to force the vertically extending clamping plate into engagement with the first end of the array.

2. The vehicle power supply of claim 1, wherein the backing plate defines a slot, and wherein the first and second wedge blocks are at least partially disposed within the slot.

3. The vehicle power supply of claim 2, wherein the backing plate defines a tapped orifice that is in communication with the slot, and wherein a fastener is threaded into the tapped orifice, extends into the slot, and is configured to engage the first wedge block such that the first wedge block engages the second wedge block to force the vertically extending clamping plate into engagement with the first end of the array.

4. The vehicle power supply of claim 1, wherein the second end of the array is secured to a front cover.

5. The vehicle power supply of claim 1, wherein first and second side rails respectively engage opposing sides of the array, and extend from the front cover to the backing plate.

6. A vehicle power supply comprising:
a housing having bottom and side walls;
a backing plate extending from the bottom wall;
a power assembly having an array of electrical switching units extending from the side wall to the backing plate; and
a clamp extending from the backing plate and configured to engage a backside of the array such that a frontside of the array is forced into engagement with the side wall, the clamp including a vertically extending clamping plate, a first wedge block, and a second wedge block, wherein the vertically extending clamping plate engages the backside of the array, the first wedge block tapers in a first direction from the backing plate toward the side wall, the second wedge block extends from a backside of the vertically extending clamping plate and tapers in a second direction that is opposite the first direction, and wherein the first wedge block is configured to engage the second wedge block to force the vertically extending clamping plate into engagement with the backside of the array.

7. The vehicle power supply of claim 6, wherein the backing plate defines a slot, and wherein the first and second wedge blocks are at least partially disposed within the slot.

8. The vehicle power supply of claim 7, wherein the backing plate defines a tapped orifice that is in communication with the slot, and wherein a fastener is threaded into the tapped orifice, extends into the slot, and is configured to engage the first wedge block such that the first wedge block engages the second wedge block to force the vertically extending clamping plate into engagement with the backside of the array.

9. The vehicle power supply of claim 6, wherein the frontside of the array is secured to a front cover.

10. The vehicle power supply of claim 6, wherein first and second side rails respectively engage opposing sides of the array, and extend from the front cover to the backing plate.

11. A vehicle power supply comprising:
lower and vertical housing walls;
a backing plate extending from the lower wall such that a gap is defined between the backing plate and vertical wall;
an array of electrical switching units disposed within the gap;
a clamping plate extending from the backing plate and configured to engage a proximal end of the array to force a distal end of the array into engagement with the vertical wall; and
first and second wedge blocks, the first wedge block tapering in a first direction from the backing plate toward the vertical wall, the second wedge block extending from a backside of the clamping plate and tapering in a second direction that is opposite the first direction, wherein the first wedge block is configured to engage the second wedge block to force the clamping plate into engagement with the proximal end of the array.

12. The vehicle power supply of claim 11, wherein the backing plate defines a slot, and wherein the first and second wedge blocks are at least partially disposed within the slot.

13. The vehicle power supply of claim 12, wherein the backing plate defines a tapped orifice that is in communication with the slot, and wherein a fastener is threaded into the tapped orifice, extends into the slot, and is configured to engage the first wedge block such that the first wedge block engages the second wedge block to force the clamping plate into engagement with the proximal end of the array.

14. The vehicle power supply of claim 11, wherein the distal end of the array is secured to a front cover.

15. The vehicle power supply of claim 11, wherein first and second side rails respectively engage opposing sides of the array, and extend from the front cover to the backing plate.

* * * * *